(12) United States Patent
Xiang

(10) Patent No.: US 11,450,823 B2
(45) Date of Patent: Sep. 20, 2022

(54) METHOD OF MANUFACTURING FLEXIBLE SUBSTRATE

(71) Applicant: TCL China Star Optoelectronics Technology Co., Ltd., Shenzhen (CN)

(72) Inventor: Xiaoqun Xiang, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 441 days.

(21) Appl. No.: 16/625,766

(22) PCT Filed: Mar. 18, 2019

(86) PCT No.: PCT/CN2019/078423
§ 371 (c)(1),
(2) Date: Dec. 23, 2019

(87) PCT Pub. No.: WO2020/073606
PCT Pub. Date: Apr. 16, 2020

(65) Prior Publication Data
US 2021/0296598 A1 Sep. 23, 2021

(30) Foreign Application Priority Data
Oct. 9, 2018 (CN) .......................... 201811172445.2

(51) Int. Cl.
*H01L 51/00* (2006.01)
*C25D 7/12* (2006.01)
(52) U.S. Cl.
CPC .......... *H01L 51/0097* (2013.01); *C25D 7/123* (2013.01); *H01L 51/003* (2013.01); *H01L 2251/5338* (2013.01)

(58) Field of Classification Search
CPC ... H01L 51/0097; H01L 51/003; C25D 7/123; H05B 33/00
See application file for complete search history.

(56) References Cited

U.S. PATENT DOCUMENTS 8,617,362 B2 * 12/2013 Fredenberg ............ C25D 1/003
204/290.01
2014/0008657 A1 1/2014 Lu et al.
(Continued)

FOREIGN PATENT DOCUMENTS

| CN | 102362305 | 2/2012 |
| CN | 102769109 | 11/2012 |

(Continued)

*Primary Examiner* — Sardis F Azongha

(57) ABSTRACT

A method of manufacturing a flexible substrate includes a step of preparing a multilayered board and a step of electrolysis. The step of preparing the multilayered board includes forming a thin-film metal layer on a base; next, forming a transparent protective layer on the thin-film metal layer; and then forming a flexible underlay on the transparent protective layer so that the multilayered board is formed. The step of electrolysis includes providing an electrolytic cell; putting the multilayered board made up of the base, the thin-film metal layer, the transparent protective layer, and the flexible underlay in the electrolytic cell; and electrolyzing the thin-film metal layer, causing the thin-film metal layer to dissolve until the thin-film metal layer disappears, and causing the base to peel off the multilayered board. Lastly, the flexible substrate retaining the transparent protective layer and the flexible underlay is formed.

12 Claims, 6 Drawing Sheets

(56) References Cited

U.S. PATENT DOCUMENTS

2018/0123058 A1   5/2018   Fang
2019/0273213 A1*  9/2019   Niu ..................... H01L 27/1259

FOREIGN PATENT DOCUMENTS

| CN | 103280541       | 9/2013  |
|----|-----------------|---------|
| CN | 105702625       | 6/2016  |
| CN | 106232351       | 12/2016 |
| CN | 109461844       | 3/2019  |
| KR | 10-2012-0062193 | 6/2012  |

* cited by examiner

METHOD OF MANUFACTURING FLEXIBLE SUBSTRATE

RELATED APPLICATIONS

This application is a National Phase of PCT Patent Application No. PCT/CN2019/078423 having International filing date of Mar. 18, 2019, which claims the benefit of priority of Chinese Patent Application No. 201811172445.2 filed on Oct. 9, 2018. The contents of the above applications are all incorporated by reference as if fully set forth herein in their entirety.

BACKGROUND OF DISCLOSURE

Field and Background of the Invention

The present disclosure relates to the field of display technology, and more particularly, to a method of manufacturing a flexible substrate.

With rapid technological development, bendable flexible devices, such as display devices, chips, circuits, powers, sensors, and so on, which are made of flexible substrates will become the next generation of mainstream optoelectronic equipment instead of conventional optoelectronic devices and have more advantages on costs and user experience. In the case of flexible display devices, components are prepared on a surface of a substrate made of flexible materials. For a flexible organic light-emitting diode display device or a flexible liquid crystal display device (flexible LCD), a flexible substrate needs to be prepared on a surface of a rigid substrate first or adsorbed, then components are prepared, and lastly the flexible substrate is peeled from the rigid substrate. Thus, how to efficiently peel the flexible substrate from the rigid substrate is one key production technology for flexible devices.

Currently, the method of peeling the flexible substrate mainly includes the following methods: (1) mechanization, (2) chemical etching, and (3) laser. Although the methods can efficiently peel the flexible substrate from the rigid substrate and realize mass production, they often cause greater damage to the flexible substrate, so that product yield and costs cannot be guaranteed, and lifetimes of the flexible display devices are reduced. In order to improve product yield and reduce costs, it is urgent to develop a gentle method which is easy to operate and low-cost.

Therefore, it is necessary to provide a method of manufacturing a flexible substrate to solve the above problems.

SUMMARY OF THE INVENTION

A technical problem is that, when a flexible substrate is peeled from a rigid substrate, the flexible substrate is often seriously damaged, so that product yield and costs cannot be guaranteed, and lifetimes of flexible display devices are reduced.

The object of the present disclosure is to provide a method of manufacturing a flexible substrate. The manufacturing process of the method is simple and effective to protect components, thereby causing product yield of the flexible substrate to be improved so that manufacturing costs are reduced.

In order to realize the above object, the present disclosure provides a method of manufacturing a flexible substrate, including:

a step of preparing a multilayered board, including: forming a thin-film metal layer on a base; forming a transparent protective layer on the thin-film metal layer; and forming a flexible underlay on the transparent protective layer so that the multilayered board is formed;

forming a device layer on the flexible underlay of the multilayered board;

forming another multilayered board through the step of preparing the multilayered board;

causing a flexible underlay of the another multilayered board to face the device layer on the multilayered board and joining the another multilayered board and the multilayered board to form an assembly; and a step of electrolysis, including: providing an electrolytic cell including an anode and a cathode, wherein the electrolytic cell contains an electrolyte, and wherein the anode and the cathode are disposed in the electrolyte in the electrolytic cell; putting the multilayered board made up of the base, the thin-film metal layer, the transparent protective layer, and the flexible underlay in the electrolytic cell; and electrolyzing the thin-film metal layer, causing the thin-film metal layer to dissolve until the thin-film metal layer disappears, and causing the base to peel off the multilayered board, so that the flexible substrate retaining the transparent protective layer and the flexible underlay is formed.

In some embodiments, the step of forming the thin-film metal layer on the base includes forming the thin-film metal layer through an evaporation method.

In some embodiments, the step of forming the transparent protective layer on the thin-film metal layer includes forming the transparent protective layer through a coating method.

In some embodiments, the method of manufacturing the flexible substrate further includes:

applying the step of electrolysis to the multilayered board of the assembly and causing the base of the multilayered board to peel off the multilayered board;

providing a flipping device;

flipping, by the flipping device, the rest of the assembly without the base and causing the another multilayered board to be located under the device layer; and applying the step of electrolysis to the another multilayered board and causing a base of the another multilayered board to peel off the another multilayered board.

In some embodiments, the method of manufacturing the flexible substrate further includes:

providing an adsorbing device;

adsorbing and putting, by the adsorbing device, the assembly in the electrolytic cell, causing the thin-film metal layer of the multilayered board to contact the anode, and causing the flexible underlay of the multilayered board to be located above a surface of the electrolyte in the electrolytic cell prior to the step of applying the step of electrolysis to the multilayered board of the assembly; and adsorbing and putting, by the adsorbing device, the rest of the flipped assembly in the electrolytic cell, causing a thin-film metal layer of the another multilayered board to contact the anode, and causing the flexible underlay of the another multilayered board to be located above the surface of the electrolyte in the electrolytic cell prior to the step of applying the step of electrolysis to the another multilayered board.

In order to realize the above object, the present disclosure provides a method of manufacturing a flexible substrate, including:

a step of preparing a multilayered board, including: forming a thin-film metal layer on a base; forming a transparent protective layer on the thin-film metal layer; and forming a flexible underlay on the transparent protective layer so that the multilayered board is formed; and a step of electrolysis, including: providing an electrolytic cell; putting the multilayered board made up of the base, the thin-film metal layer, the transparent protective layer, and the flexible underlay in the electrolytic cell; and electrolyzing the thin-film metal layer, causing the thin-film metal layer to dissolve until the thin-film metal layer disappears, and causing the base to peel off the multilayered board, so that the flexible substrate retaining the transparent protective layer and the flexible underlay is formed.

In some embodiments, the step of forming the thin-film metal layer on the base includes forming the thin-film metal layer through an evaporation method.

In some embodiments, the step of forming the transparent protective layer on the thin-film metal layer includes forming the transparent protective layer through a coating method.

In some embodiments, the method further includes, prior to the step of electrolysis, the steps of:

forming a device layer on the flexible underlay of the multilayered board;

forming another multilayered board through the step of preparing the multilayered board; and causing a flexible underlay of the another multilayered board to face the device layer on the multilayered board and joining the another multilayered board and the multilayered board to form an assembly.

In some embodiments, the method of manufacturing the flexible substrate further includes:

applying the step of electrolysis to the multilayered board of the assembly and causing the base of the multilayered board to peel off the multilayered board;

providing a flipping device;

flipping, by the flipping device, the rest of the assembly without the base and causing the another multilayered board to be located under the device layer; and applying the step of electrolysis to the another multilayered board and causing a base of the another multilayered board to peel off the another multilayered board.

In some embodiments, the method of manufacturing the flexible substrate further includes:

providing an adsorbing device;

adsorbing and putting, by the adsorbing device, the assembly in the electrolytic cell, causing the thin-film metal layer of the multilayered board to contact the anode, and causing the flexible underlay of the multilayered board to be located above a surface of the electrolyte in the electrolytic cell prior to the step of applying the step of electrolysis to the multilayered board of the assembly; and adsorbing and putting, by the adsorbing device, the rest of the flipped assembly in the electrolytic cell, causing a thin-film metal layer of the another multilayered board to contact the anode, and causing the flexible underlay of the another multilayered board to be located above the surface of the electrolyte in the electrolytic cell prior to the step of applying the step of electrolysis to the another multilayered board.

In some embodiments, the device layer includes a light-emitting device.

In some embodiments, the base is a glass substrate.

In some embodiments, the thin-film metal layer includes at least one material selected from a group consisting of copper and aluminum.

In some embodiments, the transparent protective layer includes at least one material selected from a group consisting of silicon nitride (SiNx) and silicon oxide (SiOx).

In some embodiments, material composition of the flexible underlay includes organic polymers.

In some embodiments, the organic polymers are polyimides.

In some embodiments, the electrolytic cell includes an anode and a cathode, wherein the electrolytic cell contains an electrolyte, and wherein the anode and the cathode are disposed in the electrolyte in the electrolytic cell.

In some embodiments, the electrolyte is a copper sulphate solution.

The beneficial effect of the present disclosure is that, the manufacturing process of the method of manufacturing the flexible substrate is simple and effective to protect components, thereby causing product yield of the flexible substrate to be improved so that manufacturing costs are reduced.

BRIEF DESCRIPTION OF THE SEVERAL VIEWS OF THE DRAWINGS

To ensure the features and the technical content of the disclosure are more apparent and easier to understand, please refer to the explanation and the accompanying drawings of the disclosure as follows. However, the accompanying drawings are merely for reference without limiting the disclosure.

DESCRIPTION OF SPECIFIC EMBODIMENTS OF THE INVENTION

To ensure the objects, the technical solutions, and the effects of the disclosure are clearer and more specific, the disclosure will be explained in conjunction with the accompanying drawings in detail further below. It should be understood that the embodiments described herein are merely a part of the embodiments of the present disclosure instead of all of the embodiments and not used to limit the disclosure.

Figure 1:
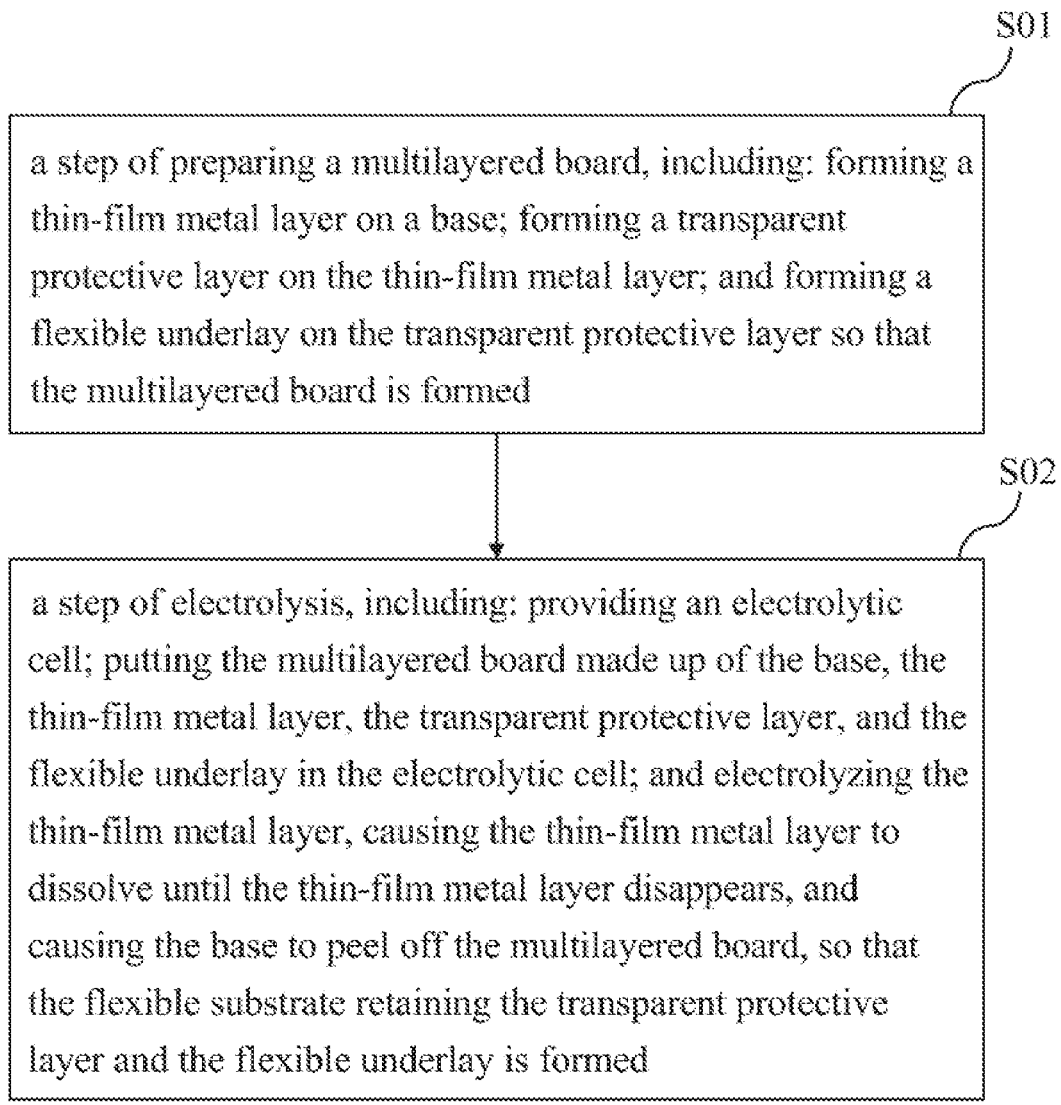
FIG. 1 is a flowchart illustrating a method of manufacturing a flexible substrate according to an embodiment of the present disclosure.

Please refer to FIG. 1, which is a flowchart illustrating a method of manufacturing a flexible substrate according to an embodiment of the present disclosure. The method includes a step S01 of preparing a multilayered board and a step S02 of electrolysis.

Figure 2:
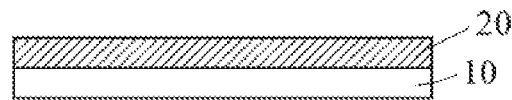
FIGS. 2, 3, 4 and 5 are cross-sectional views corresponding to a step S01 of preparing a multilayered board, applied in FIG. 1.

FIGS. 2, 3, 4 and 5 are cross-sectional views corresponding to the step S01 of preparing the multilayered board, applied in FIG. 1. First, as shown in FIG. 2, a thin-film metal layer 20 is formed on a base 10. Specifically, the thin-film metal layer 20 is formed through an evaporation method. The base 10 is a glass substrate. The thin-film metal layer 20 includes at least one material selected from a group consisting of copper and aluminum.

Figure 3:
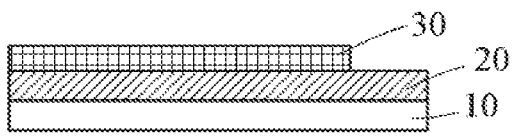

As shown in FIG. 3, a transparent protective layer 30 is formed on the thin-film metal layer 20. Specifically, the transparent protective layer 30 is formed through a coating method. The transparent protective layer 30 includes at least one material selected from a group consisting of silicon nitride (SiNx) and silicon oxide (SiOx).

Figure 4:
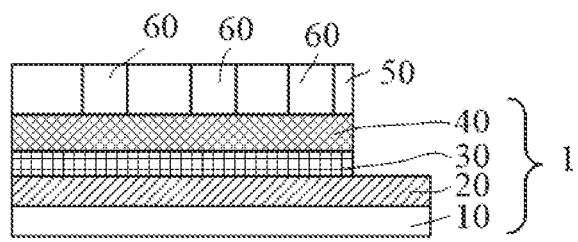

As shown in FIG. 4, a flexible underlay 40 is formed on the transparent protective layer 30 so that the multilayered board 1 is formed. Specifically, material composition of the flexible underlay 40 includes organic polymers, such as polyimides (PI).

Figure 5:
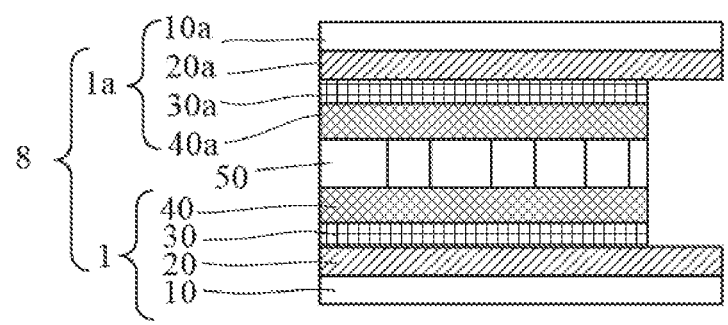

Further, the manufacturing method of the present disclosure further includes, prior to the step S02 of electrolysis, the steps of: forming a device layer 50 on the flexible underlay 40 of the multilayered board 1 (as shown in FIG. 4); forming another multilayered board 1a through the step S01 of preparing the multilayered board (as shown in FIG. 5); and causing a flexible underlay 40a of the multilayered board 1a to face the device layer 50 on the multilayered board 1 and joining the multilayered board 1a and the multilayered board 1 to form an assembly 8 (as shown in FIG. 5). Specifically, the device layer 50 includes a light-emitting device 60 (as shown in FIG. 4) and a structure of thin-film transistors (not shown) in an ordinary organic light-emitting diode (OLED) structure or a liquid crystal display (LCD) structure. In the present embodiment, the internal structure of the device layer 50 belongs to conventional technical fields and is not repeated here. In addition, specifically, a base 10a, a thin-film metal layer 20a, a transparent protective layer 30a, and the flexible underlay 40a of the multilayered board 1a are, but not limited to, the same in manufacturing process and material as those of the multilayered board 1.

Figure 6:
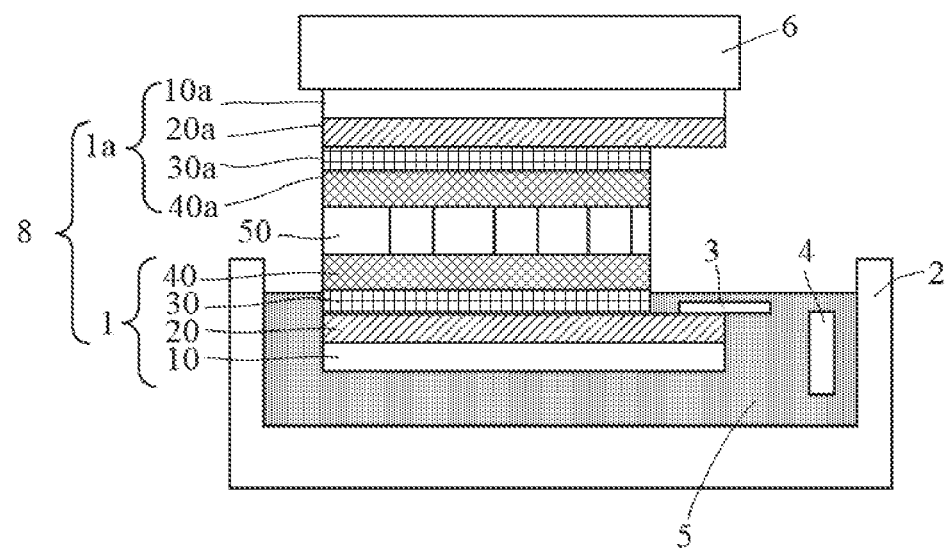
FIGS. 6-7 are cross-sectional views corresponding to a step S02 of electrolysis, applied to a multilayered board 1 in FIG. 1.
Figure 7:
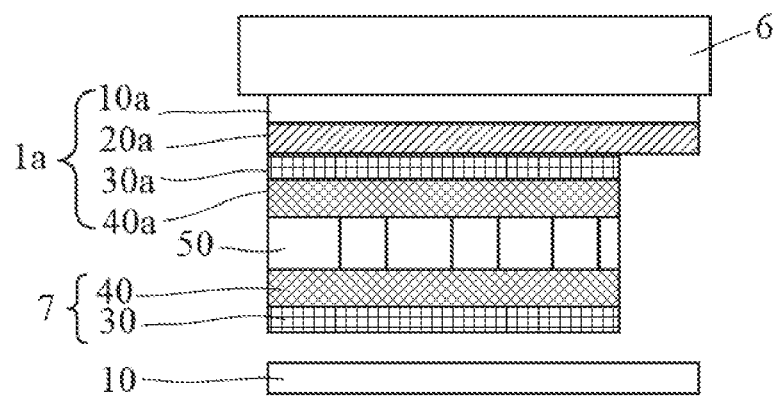

FIGS. 6-7 are cross-sectional views corresponding to the step S02 of electrolysis, applied to the multilayered board 1 in FIG. 1. First, providing an electrolytic cell 2. Specifically, the electrolytic cell 2 includes an anode 3 and a cathode 4. The electrolytic cell 2 contains an electrolyte 5. The anode 3 and the cathode 4 are disposed in the electrolyte 5 in the electrolytic cell 2. The electrolyte 5 is a copper sulphate solution.

As shown in FIG. 6, applying the step S02 of electrolysis to the multilayered board 1 of the assembly 8, which includes the steps of: putting the multilayered board 1 made up of the base 10, the thin-film metal layer 20, the transparent protective layer 30, and the flexible underlay 40 in the electrolytic cell 2; and electrolyzing the thin-film metal layer 20, causing the thin-film metal layer 20 to dissolve until the thin-film metal layer 20 disappears, and causing the base 10 to peel off the multilayered board 1, so that the flexible substrate 7 retaining the transparent protective layer 30 and the flexible underlay 40 is formed (as shown in FIG. 7). Specifically, electrolyzing the thin-film metal layer 20 through connecting a power (not shown) between the anode 3 and the cathode 4, and causing the thin-film metal layer 20 to dissolve until the thin-film metal layer 20 disappears.

As further shown in FIG. 6, the manufacturing method of the present disclosure further includes the steps of: providing an adsorbing device 6; and adsorbing and putting, by the adsorbing device 6, the assembly 8 in the electrolytic cell 2, causing the thin-film metal layer 20 of the multilayered board 1 to contact the anode 3, and causing the flexible underlay 40 of the multilayered board 1 to be located above a surface of the electrolyte 5 in the electrolytic cell 2 prior to the step of applying the step S02 of electrolysis to the multilayered board 1 of the assembly 8.

Specifically, the adsorbing device 6 adsorbs the assembly 8 through vacuum adsorption or physical adhesion, that is, the adsorbing device 6 adsorbs the base 10a of the multilayered board 1a and puts the multilayered board 1 in the electrolyte 5.

Figure 8:
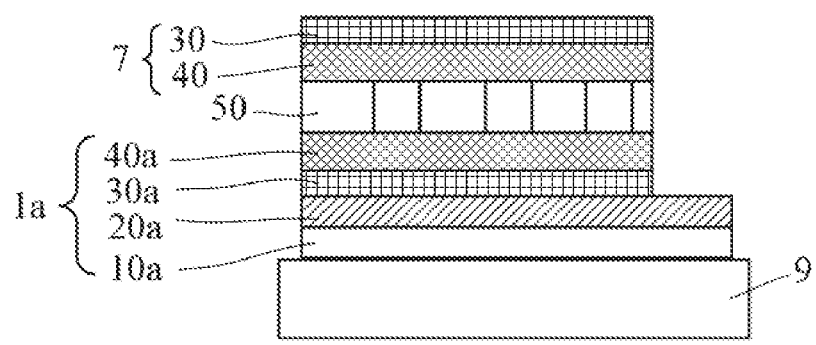
FIGS. 8, 9, 10 and 11 are cross-sectional views corresponding to the step S02 of electrolysis, applied to another multilayered board 1a in FIG. 1.

FIGS. 8, 9, 10 and 11 are cross-sectional views corresponding to the step S02 of electrolysis, applied to another multilayered board 1a in FIG. 1. Further, the manufacturing method of the present disclosure further includes providing a flipping device 9; and flipping, by the flipping device 9, the rest of the assembly 8 without the base 10 and causing the multilayered board 1a to be located under the device layer 50 (as shown in FIG. 8). Specifically, the flipping device 9 also has a function of adsorption, that is, as lastly shown in FIG. 8, the flipping device 9 adsorbs and flips the rest of the assembly 8 after the adsorbing device 6 releases the rest of the assembly 8.

Figure 9:
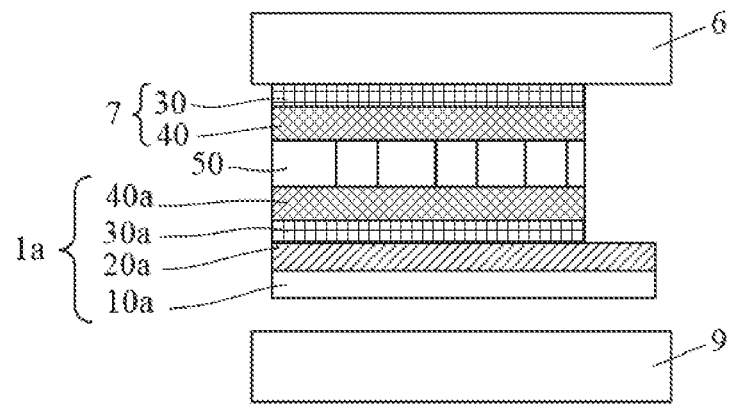
Figure 10:
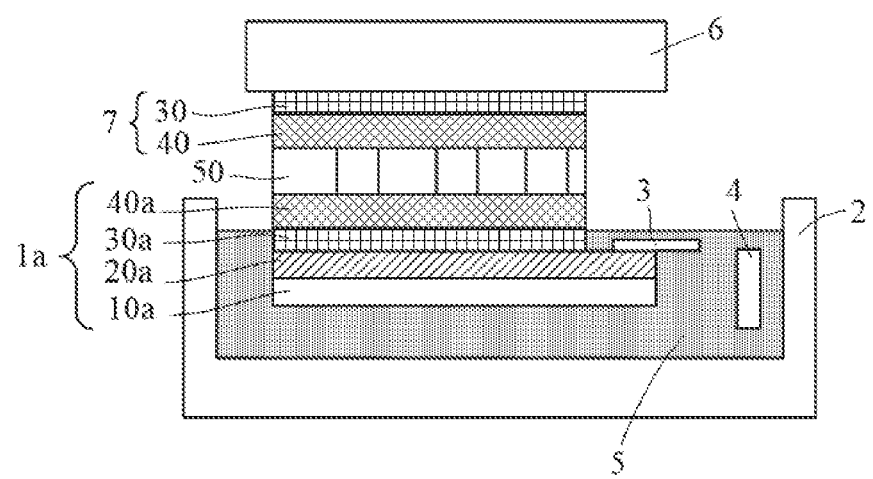

As shown in FIG. 9 and FIG. 10, adsorbing and putting, by the adsorbing device 6, the rest of the flipped assembly 8 in the electrolytic cell 2, causing the thin-film metal layer 20a of the multilayered board 1a to contact the anode 3, and causing the flexible underlay 40a of the multilayered board 1a to be located above the surface of the electrolyte 5 in the electrolytic cell 2 prior to the step of applying the step S02 of electrolysis to the multilayered board 1a. Specifically, the flipping device 9 releases the rest of the assembly 8, and then the adsorbing device 6 adsorbs the rest of the assembly 8. The adsorbing device 6 adsorbs the transparent protective layer 30 of the flexible substrate 7 through vacuum adsorption or physical adhesion and puts the multilayered board 1a in the electrolyte 5.

Figure 11:
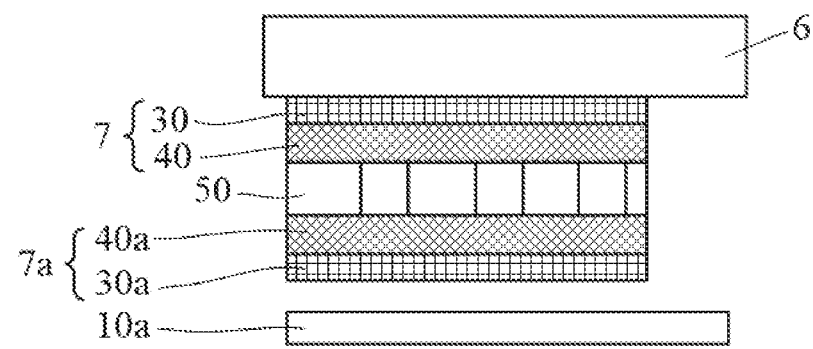

As shown in FIG. 10, applying the step S02 of electrolysis to the multilayered board 1a, which includes the steps of: putting the multilayered board 1a made up of the base 10a, the thin-film metal layer 20a, the transparent protective layer 30a, and the flexible underlay 40a in the electrolytic cell 2; and electrolyzing the thin-film metal layer 20a, causing the thin-film metal layer 20a to dissolve until the thin-film metal layer 20a disappears, and causing the base 10a to peel off the multilayered board 1a, so that the flexible substrate 7a retaining the transparent protective layer 30a and the flexible underlay 40a is formed (as shown in FIG. 11). Specifically, electrolyzing the thin-film metal layer 20a through connecting the power (not shown) between the anode 3 and the cathode 4, and causing the thin-film metal layer 20a to dissolve until the thin-film metal layer 20a disappears.

Figure 12:
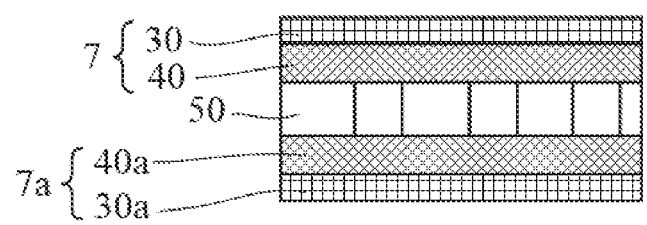
FIG. 12 is a cross-sectional view of the flexible substrate made according to the manufacturing method of the present disclosure.

FIG. 12 is a cross-sectional view of the flexible substrate made according to the manufacturing method of the present disclosure. As shown in the figure, a display device, such as a flexible OLED, having a double-layer structure composed of the flexible substrates 7 and 7a can realize a bended type or a roll type specifically. Moreover, in the present disclosure, the manufacturing process of the method of manufacturing the flexible substrate is simple and effective to protect components, thereby causing product yield of the flexible substrate to be improved so that manufacturing costs are reduced.

It should be understood that the application of the present disclosure is not limited by the foregoing examples. A person of ordinary skill in the art is able to make modifications or changes based on the foregoing description, and all of these modifications and changes are within the scope of the appended claims of the present disclosure.

The industrial applicability of the present disclosure is that, the manufacturing process of the method of manufacturing the flexible substrate is simple and effective to protect components, thereby causing product yield of the flexible substrate to be improved so that manufacturing costs are reduced.

What is claimed is:

1. A method of manufacturing a flexible substrate, comprising:
 a step of preparing a multilayered board, comprising:
  forming a thin-film metal layer on a base;
  forming a transparent protective layer on the thin-film metal layer; and
  forming a flexible underlay on the transparent protective layer so that the multilayered board is formed;
  forming a device layer on the flexible underlay of the multilayered board;
  forming another multilayered board through the step of preparing the multilayered board;
  causing a flexible underlay of the another multilayered board to face the device layer on the multilayered board and joining the another multilayered board and the multilayered board to form an assembly; and
 a step of electrolysis, comprising:
  providing an electrolytic cell comprising an anode and a cathode, wherein the electrolytic cell contains an electrolyte, and wherein the anode and the cathode are disposed in the electrolyte in the electrolytic cell;
  putting the multilayered board made up of the base, the thin-film metal layer, the transparent protective layer, and the flexible underlay in the electrolytic cell; and
  electrolyzing the thin-film metal layer, causing the thin-film metal layer to dissolve until the thin-film metal layer disappears, and causing the base to peel off the multilayered board, so that the flexible substrate retaining the transparent protective layer and the flexible underlay is formed.

2. The method of claim 1, wherein the step of forming the thin-film metal layer on the base comprises forming the thin-film metal layer through an evaporation method.

3. The method of claim 1, wherein the step of forming the transparent protective layer on the thin-film metal layer comprises forming the transparent protective layer through a coating method.

4. The method of claim 1, further comprising:
 applying the step of electrolysis to the multilayered board of the assembly and causing the base of the multilayered board to peel off the multilayered board;
 providing a flipping device;
 flipping, by the flipping device, the rest of the assembly without the base and causing the another multilayered board to be located under the device layer; and
 applying the step of electrolysis to the another multilayered board and causing a base of the another multilayered board to peel off the another multilayered board.

5. The method of claim 4, further comprising:
 providing an adsorbing device;
 adsorbing and putting, by the adsorbing device, the assembly in the electrolytic cell, causing the thin-film metal layer of the multilayered board to contact the anode, and causing the flexible underlay of the multilayered board to be located above a surface of the electrolyte in the electrolytic cell prior to the step of applying the step of electrolysis to the multilayered board of the assembly; and
 adsorbing and putting, by the adsorbing device, the rest of the flipped assembly in the electrolytic cell, causing a thin-film metal layer of the another multilayered board to contact the anode, and causing the flexible underlay of the another multilayered board to be located above the surface of the electrolyte in the electrolytic cell prior to the step of applying the step of electrolysis to the another multilayered board.

6. The method of claim 1, wherein the device layer comprises a light-emitting device.

7. The method of claim 1, wherein the base is a glass substrate.

8. The method of claim 1, wherein the thin-film metal layer comprises at least one material selected from a group consisting of copper and aluminum.

9. The method of claim 1, wherein the transparent protective layer comprises at least one material selected from a group consisting of silicon nitride (SiNx) and silicon oxide (SiOx).

10. The method of claim 1, wherein material composition of the flexible underlay comprises organic polymers.

11. The method of claim 10, wherein the organic polymers are polyimides.

12. The method of claim 1, wherein the electrolyte is a copper sulphate solution.

* * * * *